(12) United States Patent
Zhou et al.

(10) Patent No.: US 10,111,359 B2
(45) Date of Patent: Oct. 23, 2018

(54) SERVER RACK

(71) Applicant: HONGFUJIN PRECISION ELECTRONICS (TIANJIN) CO.,LTD., Tianjin (CN)

(72) Inventors: Hai-Chen Zhou, Shenzhen (CN); Guang-Yi Zhang, Shenzhen (CN); Jia-Qi Fu, Shenzhen (CN)

(73) Assignee: HONGFUJIN PRECISION ELECTRONICS (TIANJIN) CO., LTD., Tianjin (CN)

( * ) Notice: Subject to any disclaimer, the term of this patent is extended or adjusted under 35 U.S.C. 154(b) by 0 days.

(21) Appl. No.: 15/473,823

(22) Filed: Mar. 30, 2017

(65) Prior Publication Data

US 2018/0184540 A1 Jun. 28, 2018

(30) Foreign Application Priority Data

Dec. 23, 2016 (CN) .......................... 2016 1 1207344

(51) Int. Cl.
| | |
|---|---|
| *G06F 1/16* | (2006.01) |
| *H05K 5/00* | (2006.01) |
| *H05K 7/00* | (2006.01) |
| *H05K 7/14* | (2006.01) |

(52) U.S. Cl.
CPC ................. *H05K 7/1492* (2013.01)

(58) Field of Classification Search
CPC .. H05K 7/1492; H05K 7/1494; H05K 7/1491; H05K 7/1489; H05K 7/1488; H05K 7/1487; H05K 7/1485

USPC ......... 361/724–727; 312/223.1, 223.2, 223.3
See application file for complete search history.

(56) References Cited

U.S. PATENT DOCUMENTS

| | | | | |
|---|---|---|---|---|
| 9,232,678 | B2* | 1/2016 | Bailey | H05K 7/1489 |
| 9,681,576 | B2* | 6/2017 | Schroeder | H05K 7/183 |
| 9,832,912 | B2* | 11/2017 | Klein | H05K 7/20745 |
| 2002/0181197 | A1* | 12/2002 | Huang | G11B 33/128 361/679.39 |
| 2003/0002261 | A1* | 1/2003 | Berry | H05K 7/1489 361/727 |
| 2009/0034181 | A1* | 2/2009 | Gizycki | H01R 13/652 361/679.02 |
| 2010/0172087 | A1* | 7/2010 | Jeffery | G11B 33/02 361/679.33 |
| 2013/0077900 | A1* | 3/2013 | Lowe | A47B 88/08 384/18 |
| 2014/0204537 | A1* | 7/2014 | Rust | G11B 33/128 361/727 |

* cited by examiner

*Primary Examiner* — Anthony Haughton
(74) *Attorney, Agent, or Firm* — ScienBiziP, P.C.

(57) ABSTRACT

A server rack configured to provide electrical connections with data storage modules upon contact includes a shell and a slide rail module slidably installed on the shell. The shell includes a power supply module. The slide rail module itself is electrically conductive and provided with a cable at each end. The cables are connected with the power supply module and the data storage module, and the data storage module is electrically connected with the power supply module.

18 Claims, 5 Drawing Sheets

SERVER RACK

CROSS-REFERENCE TO RELATED APPLICATIONS

This application claims priority to Chinese Patent Application No. 201611207344.5 filed on Dec. 23, 2016 the contents of which are incorporated by reference herein.

FIELD

The subject matter herein generally relates to a server rack.

BACKGROUND

The server generally needs hot-swappable hard drive. Therefore, a server rack must receive the hard disk, and the server rack is equipped with slide rails to conveniently slide the hard drive into the rack.

BRIEF DESCRIPTION OF THE DRAWINGS

Implementations of the present technology will now be described, by way of example only, with reference to the attached figures.

DETAILED DESCRIPTION

Figure 1:
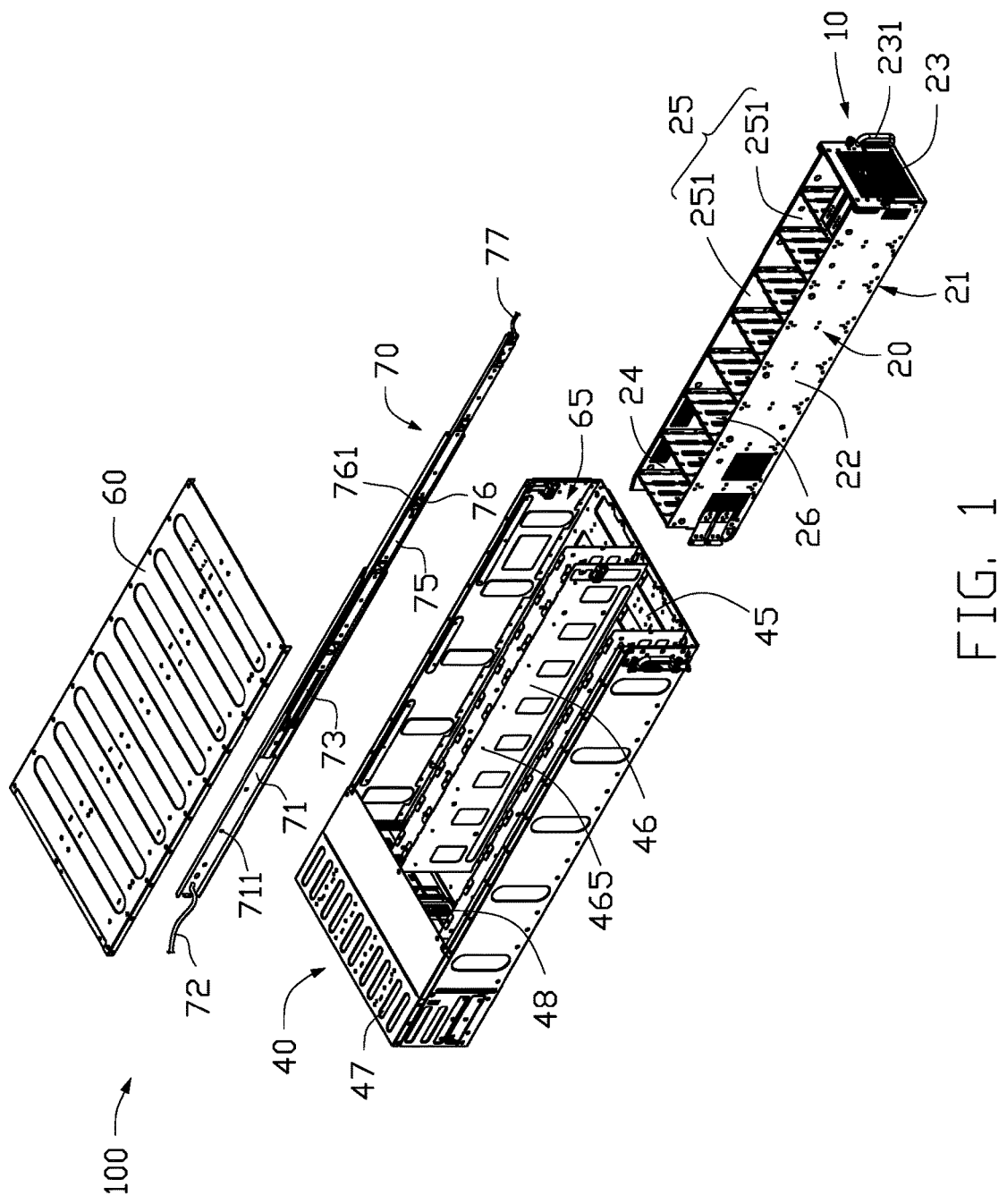
FIG. 1 is an exploded, isometric view of an exemplary embodiment of a server rack and a data storage module.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

Several definitions that apply throughout this disclosure will now be presented.

The term "outside" refers to a region that is beyond the outermost confines of a physical object. The term "inside" indicates that at least a portion of an object is contained within a boundary formed by another object. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series, and the like.

FIG. 1 illustrates one exemplary embodiment of a server rack 100 for receiving a plurality of data storage modules 10. The server rack 100 includes a shell 40 and a slide rail module 70 installed in the shell 40.

Figure 3:
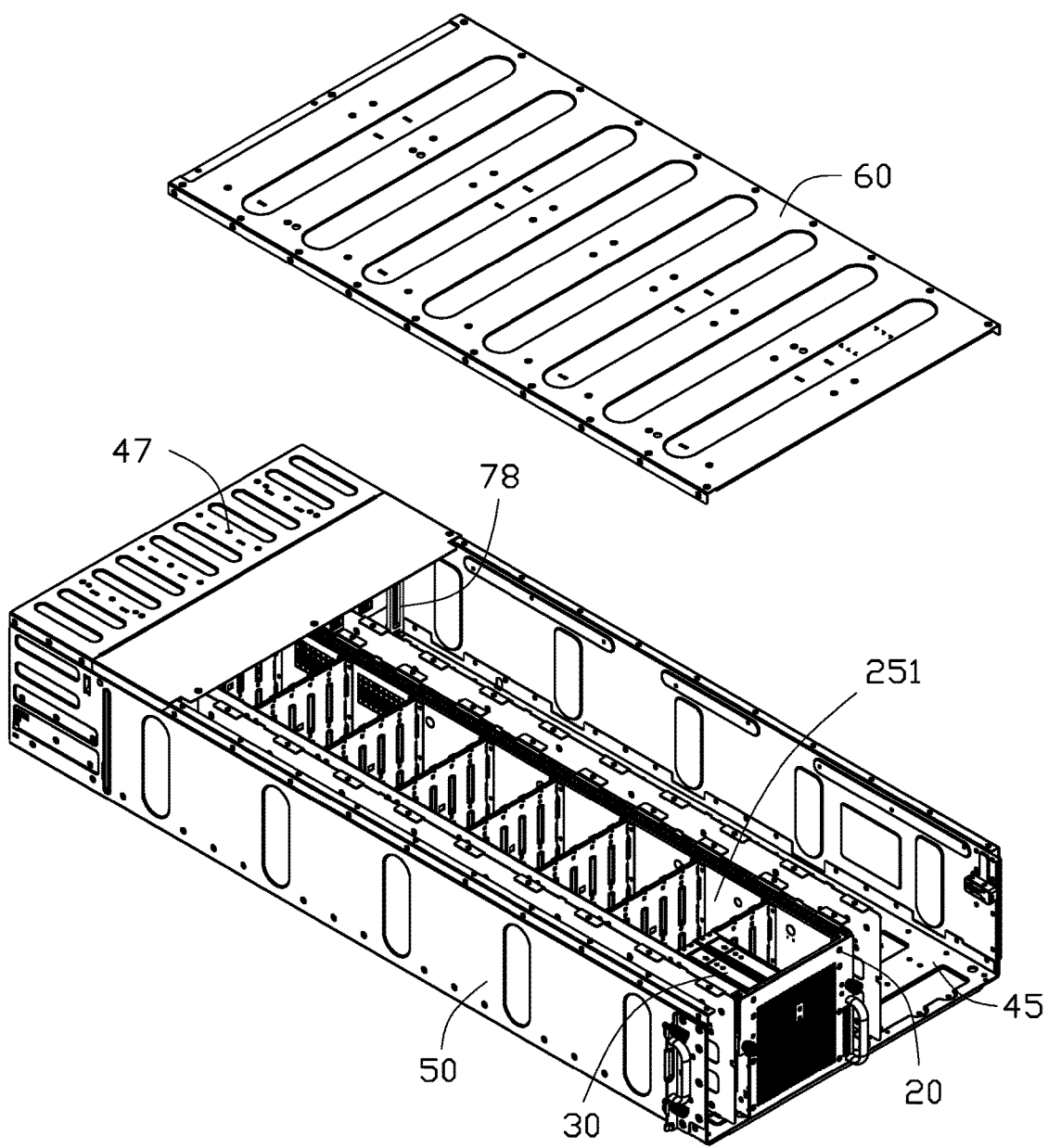
FIG. 3 is assembled, isometric view of the server rack and the data storage module of FIG. 1, a cover not being installed on the server rack.

FIG. 1 and FIG. 3 illustrate that the data storage module 10 includes a bracket 20 and a plurality of data storages 30 received in the bracket 20. The bracket 20 includes a bottom wall 21, two sidewalls 22 connected with both sides of the bottom wall 21, a front wall 23 connected with the front end of the bottom wall 21, and a rear wall 24 connected with the rear end of the bottom wall 21. The bottom wall 21, the two sidewalls 22, the front wall 23, and the rear wall 24 cooperatively define a receiving space 25 to receive the data storages 30.

The bracket 20 is provided with a plurality of baffles 26, and the baffles 26 are parallel to each other. Each end of each baffle 26 is perpendicular to the sidewall 22. The baffles 26 divide the receiving space 25 into a plurality of receiving portions 251, and each receiving portion 251 is configured to receive a plurality of data storages 30.

One of the sidewall 22 is provided with a plurality of grabs (not shown) secured on the server rack 100 to secure the bracket 20 on the server rack 100. One side of the front wall 23 is provided with a handle 231, and the handle 231 is configured to pull or push the bracket 20. The rear wall 24 is provided with a plurality of electrical connectors (not shown). The data storage 30 can be received in the bracket 20 and electrically connected with the bracket 20.

Figure 2:
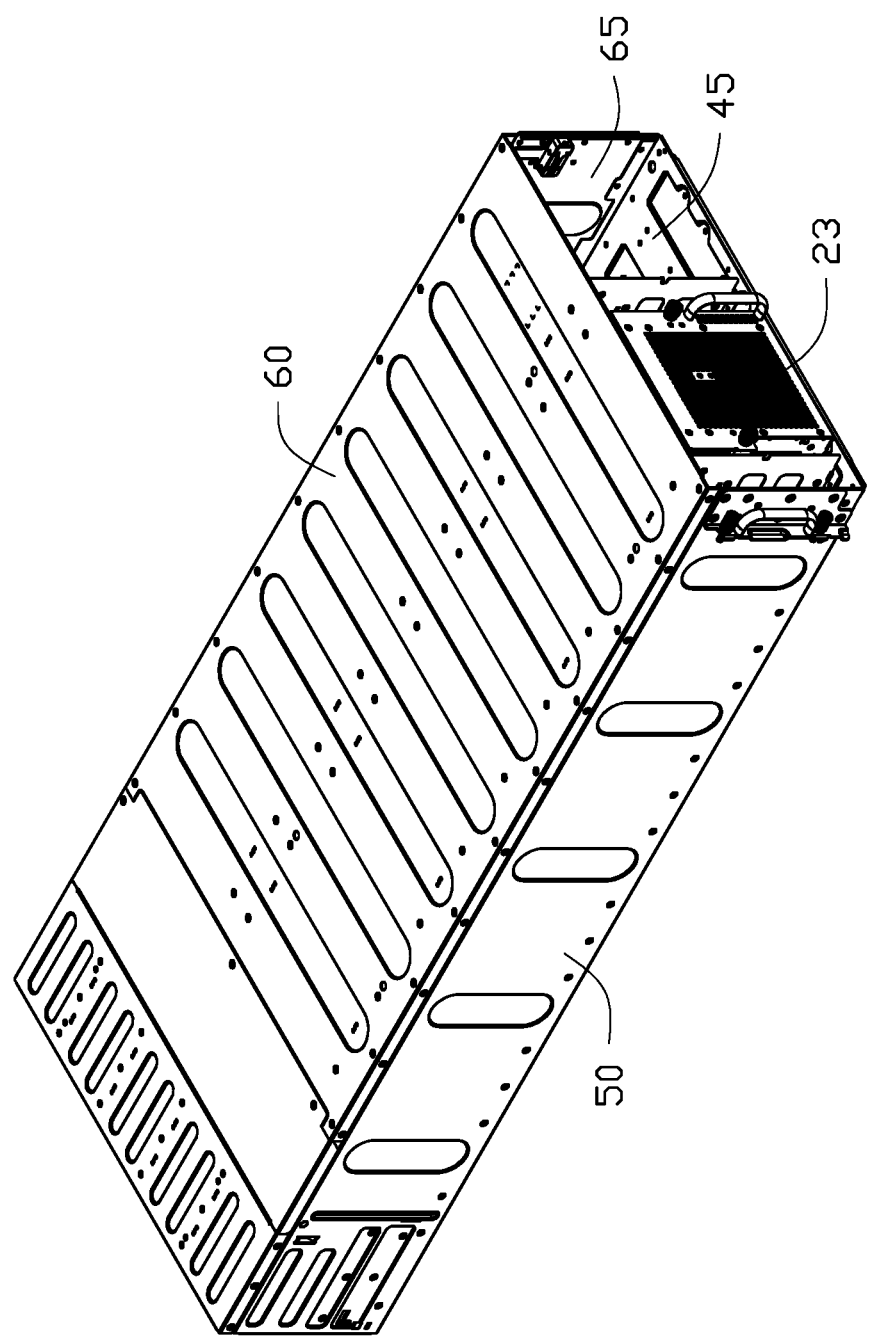
FIG. 2 is assembled, isometric view of the server rack and the data storage module of FIG. 1.

FIG. 1 to FIG. 3 illustrate that the shell 40 includes a bottom plate 45, two side plates 50 connected with the both sides of the bottom plate 45, and a cover 60 connected with two side plates 50. The bottom plate 45, the front end of the side plate 50, and a cover 60 cooperatively define an opening 65. The data storage module 10 can be inserted into the opening 65.

The bottom plate 45 is provide with a plurality of mounting plates 46, and the mounting plates 46 are perpendicularly connected with the bottom plate 45 and parallel to the side plate 50. The top end of one of the mounting plate 46 defines a plurality of mounting holes 465. A plurality of securing member (not shown) can be inserted into the mounting holes 465 to secure the slide rail module 70 on the mounting plate 46. The shell is provided with a power supply module 47 and a plurality of interfaces 48 at the rear end of the rear plate 45. The connector is inserted into the interface 48 to connect the data storage module 10 with a server.

The slide rail module 70 includes an outer rail 71, a middle rail 73 slidably installed on the outer rail 71, and an inner rail 75 slidably installed on the middle rail 73. The outer rail 71 defines a plurality of through holes 711. The securing member can pass through the through hole 711 and be inserted into the mounting hole 465 to secure the outer rail 71 on the mounting plate 46. The inner rail 75 is provided with a plurality of latch members 76. Each latch member 76 defines a latch groove 761, and the grab can be fixed in the latch groove 761 to secure the bracket 20 on the inner rail 75. The outer rail 71, the middle rail 73, and the inner rail 75 are made of a conductive material and are capable of conducting current. The outer rail 71, the middle rail 73, and the inner rail 75 are all coated with an insulating material. The insulating material may be rubber or plastic.

One end of the outer rail 71 closed to the power supply module 47 is provided with a cable 72 configured to connect the power supply module 47, so that the outer rail 71 is electrically connected to the power supply module 47. One end of the outer rail 71 away from the power supply module 47 is also provided with a cable 77 configured to connect the bracket 20 so that the inner rail 75 is electrically connected to the bracket 20.

FIGS. 2 and 3 illustrate assembly of the server rack 100. The mounting plate 46 is secured on the bottom plate 45, and the securing member passes through the through hole 711 of the outer rail 71 and is inserted into the mounting hole 465 to secure the slide rail module 70 on the mounting plate 46. The cable 72 of the outer rail 71 is electrically connected to the power supply module 47. The cover 60 is secured on the top end of the side plate 50. Thus, the server rack 100 is assembled.

The data storage 30 is placed in the receiving portion 251 of the bracket 20 and electrically connected to the bracket 20. The inner rail 75 and the middle rail 73 are slid out of the opening 65, and the grab of the sidewall 22 is latched on the latch groove 761 of the inner rail 75 to secure the bracket 20 on the slide rail 70. The cable 77 of the inner rail 75 is connected with the bracket 20 so that the inner rail 75 is electrically connected to the bracket 20. The bracket 20 is pushed to slide the inner rail 75 into the middle rail 73, and the middle rail 75 is slid into the outer rail 75. When the bracket 20 passes through the opening 65 and is received in the server rack 100, the connector of the rear wall 24 is connected with the interface 48. Then, the data storage module 10 is slidably installed on the server rack 100.

Figure 4:
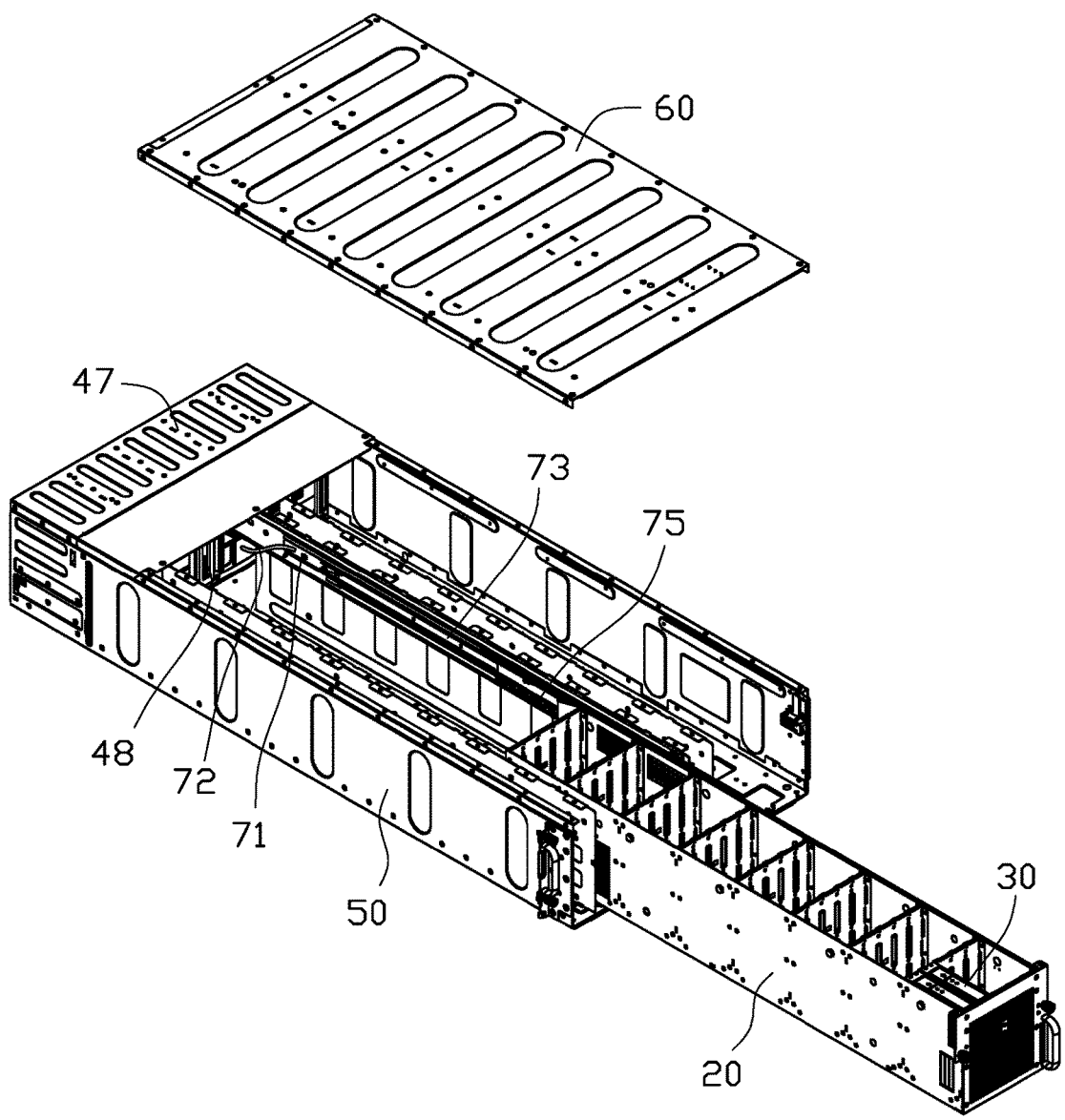
FIG. 4 is an assembled, isometric view of the server rack and the data storage of FIG. 1 in a working state.
Figure 5:
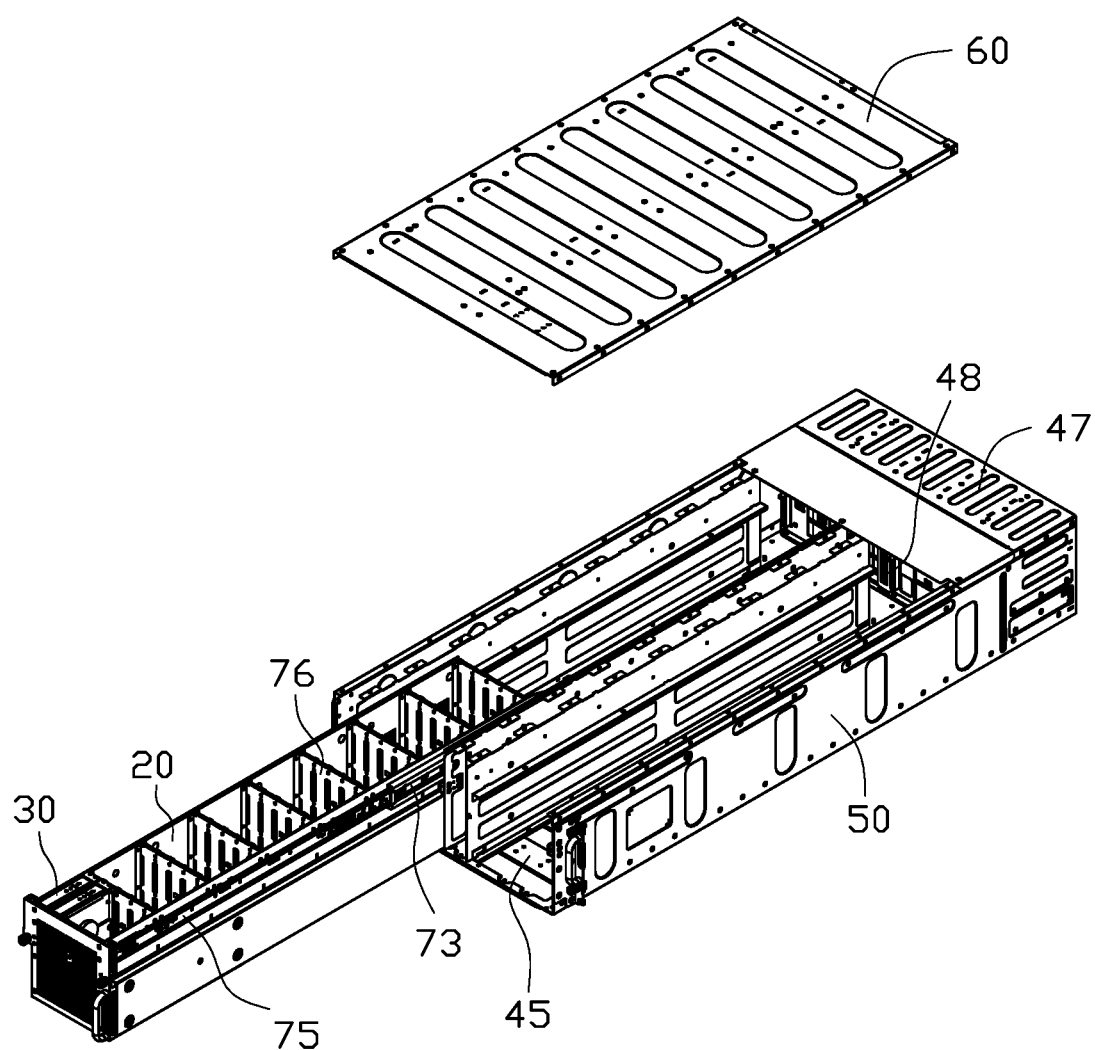
FIG. 5 is similar to FIG. 4, but viewed from another angle.

FIGS. 4 and 5 illustrate removal of the data storage module 10. The handle 231 of the bracket 20 is pulled and the bracket 20 is slid out of the opening 65. The bracket 20 remains electrically connected to the power supply module 47 through the slide rail module 70 and the cables 72, 77 (see FIG. 1) during the sliding process. The data storage 30 remains electrically connected to the bracket 20 so that the data storage 30 is electrically connected to the power supply module 47 at all times so as to prevent the data storage 30 from losing data due to power failure.

The exemplary embodiments shown and described above are only examples. Many details are often found in the art such as the other features of a server rack. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. A server rack configured to receive a plurality of data storage modules, comprising:
   a shell comprising a power supply module; and
   a slide rail module slidably installed on the shell, the slide rail module comprising two ends;
   wherein the slide rail module itself is electrically conductive, two cables are respectively connected to the two ends of the slide rail module, the cables are respectively connected with the power supply module and the data storage module, so that the data storage module is electrically connected with the power supply module.

2. The server rack of claim 1, wherein the shell comprises a bottom plate and a plurality of mounting plates connected with the bottom plate, and the slid module is secured on the mounting plate.

3. The server rack of claim 2, wherein the mounting plate defines a plurality of mounting holes, a plurality of securing members passes through the slide rail module and insert into the mounting holes to secure the slide rail module on the mounting plate.

4. The server rack of claim 3, wherein the slide rail module comprises an outer rail, and one of the cables is located on one end of the outer rail and electrically connected to the power supply module.

5. The server rack of claim 3, wherein the outer rail defines a plurality of through holes, the securing members pass through the through holes and insert into the mounting holes to secure the outer rail on the mounting plate.

6. The server rack of claim 4, wherein the slide rail module comprises a middle rail slidably installed in the outer rail and an inner rail slideably installed in the middle rail, the other cable is located at one end of the inner rail and electrically connected to the data storage module.

7. The server rack of claim 6, wherein the data storage module comprises a bracket, the cable of the inner rail is connected with the bracket and the inner rail is electrically connected to the bracket.

8. The server rack of claim 6, wherein the bracket defines a plurality of receiving portions, each receiving portion is configured to receive a plurality of data storages, the data storage is electrically connected to the slid module and the power supply module by bracket.

9. The server rack of claim 1, wherein outer surface of the slide rail module is coated with an insulating material, and the insulating material can be rubber or plastic.

10. An electronic device, comprising:
    a plurality of data storage module; and
    a server rack configured to receive the data storage modules, comprises:
      a shell comprising a power supply module; and
      a slide rail module slidably installed on the shell, the slide rail module comprising two ends;
    wherein the slide rail module itself is electrically conductive, two cables are respectively connected to the two ends of the slide rail module, the cables are respectively connected with the power supply module and the data storage module, so that the data storage module is electrically connected with the power supply module.

11. The electronic device of claim 10, wherein the shell comprises a bottom plate and a plurality of mounting plates connected with the bottom plate, and the slid module is secured on the mounting plate.

12. The electronic device of claim 11, wherein the mounting plate defines a plurality of mounting holes, a plurality of securing members passes through the slide rail module and insert into the mounting holes to secure the slide rail module on the mounting plate.

13. The electronic device of claim 12, wherein the slide rail module comprises a outer rail, and one of the cables is located on one end of the outer rail and electrically connected to the power supply module.

14. The electronic device of claim 12, wherein the outer rail defines a plurality of through holes, the securing members pass through the through holes and insert into the mounting holes to secure the outer rail on the mounting plate.

15. The electronic device of claim 13, wherein the slide rail module comprises a middle rail slidably installed in the outer rail and an inner rail slideably installed in the middle rail, the other cable is located at one end of the inner rail and electrically connected to the data storage module.

16. The electronic device of claim 15, wherein the data storage module comprises a bracket, the cable of the inner rail is connected with the bracket and the inner rail is electrically connected to the bracket.

17. The electronic device of claim 15, wherein the bracket defines a plurality of receiving portions, each receiving portion is configured to receive a plurality of data storages, the data storage is electrically connected to the slid module and the power supply module by bracket.

18. The electronic device of claim 10, wherein the outer surface of the slide rail module is coated with an insulating material, and the insulating material can be the rubber or the plastic.

* * * * *